(12) United States Patent
Tyrrell

(10) Patent No.: US 8,060,771 B2
(45) Date of Patent: Nov. 15, 2011

(54) GLITCH-FREE CLOCK SUSPEND AND RESUME CIRCUIT

(75) Inventor: Julian Tyrrell, Swindon (GB)

(73) Assignee: Dialog Semiconductor GmbH, Kirchheim/Teck-Nabern (DE)

( * ) Notice: Subject to any disclaimer, the term of this patent is extended or adjusted under 35 U.S.C. 154(b) by 631 days.

(21) Appl. No.: 12/215,804

(22) Filed: Jun. 30, 2008

(65) Prior Publication Data

US 2009/0319821 A1  Dec. 24, 2009

(30) Foreign Application Priority Data

Jun. 23, 2008 (EP) .................... 08392006

(51) Int. Cl.
 *G01V 3/08* (2006.01)
 *G01V 3/00* (2006.01)

(52) U.S. Cl. ............ 713/601; 327/99; 327/407; 327/98; 365/27; 375/373; 326/21

(58) Field of Classification Search ............ 327/99, 327/407, 298, 1, 165, 291; 365/27; 375/373; 326/21, 16
See application file for complete search history.

(56) References Cited

U.S. PATENT DOCUMENTS

| 5,448,597 | A | * | 9/1995 | Hashimoto | 375/354 |
|---|---|---|---|---|---|
| 5,574,753 | A | * | 11/1996 | Vartti et al. | 375/357 |
| 5,623,223 | A | * | 4/1997 | Pasqualini | 327/298 |
| 5,668,982 | A | * | 9/1997 | Davis | 713/600 |
| 5,808,486 | A | * | 9/1998 | Smiley | 327/34 |
| 6,021,501 | A | | 2/2000 | Shay | |
| 6,154,046 | A | * | 11/2000 | Kermani | 326/21 |
| 6,239,626 | B1 | * | 5/2001 | Chesavage | 327/99 |
| 6,266,780 | B1 | * | 7/2001 | Grundvig et al. | 713/501 |
| 6,269,043 | B1 | * | 7/2001 | Batcher | 365/227 |
| 6,292,044 | B1 | * | 9/2001 | Mo et al. | 327/298 |
| 6,324,652 | B1 | * | 11/2001 | Henderson et al. | 713/500 |
| 6,429,689 | B1 | | 8/2002 | Allen et al. | |
| 6,472,909 | B1 | * | 10/2002 | Young | 327/99 |
| 6,529,033 | B1 | * | 3/2003 | Park et al. | 326/16 |
| 6,580,776 | B2 | * | 6/2003 | Chang et al. | 377/47 |
| 6,600,345 | B1 | * | 7/2003 | Boutaud | 327/99 |
| 6,639,449 | B1 | * | 10/2003 | De La Cruz et al. | 327/407 |
| 6,819,150 | B1 | * | 11/2004 | Santosa et al. | 327/141 |
| 7,039,146 | B2 | * | 5/2006 | Chiu | 375/373 |
| 7,295,044 | B2 | | 11/2007 | Bucossi et al. | |
| 7,332,978 | B2 | * | 2/2008 | Tiwari et al. | 331/57 |
| 7,679,408 | B2 | * | 3/2010 | Hailu et al. | 327/99 |

(Continued)

FOREIGN PATENT DOCUMENTS

FR  08392006.6-1233  11/2008

*Primary Examiner* — Thomas Lee
*Assistant Examiner* — Aurel Prifti
(74) *Attorney, Agent, or Firm* — Saile Ackerman LLC; Stephen B. Ackerman

(57) ABSTRACT

Circuits and methods to provide a digital clock signal, which can be instantly halted without glitches and then resumes under control of an asynchronous suspend signal with whole width clock pulses has been achieved. The circuit suspends the clock output in either a high or a low state, instantaneously with the suspend signal. There is no restriction on either the suspend pulse width or position in relation to the input clock. The asynchronous logic implementation is using standard cell logic gates. The circuit functionality is not dependent on the manufacturing technology, i.e. CMOS, bipolar, BI-CMOS, GaAs, etc. implementations are all valid.

16 Claims, 5 Drawing Sheets

U.S. PATENT DOCUMENTS

| | | | |
|---|---|---|---|
| 7,724,059 B2 * | 5/2010 | Kapur | 327/299 |
| 2001/0043105 A1 * | 11/2001 | Zhang et al. | 327/291 |
| 2003/0048118 A1 * | 3/2003 | Nguyen et al. | 327/115 |
| 2003/0226054 A1 * | 12/2003 | Benno et al. | 713/500 |
| 2004/0104751 A1 * | 6/2004 | Campbell | 327/165 |
| 2005/0017779 A1 * | 1/2005 | Osvaldella | 327/198 |
| 2005/0168263 A1 * | 8/2005 | Fukuda et al. | 327/535 |
| 2006/0006909 A1 * | 1/2006 | Morigaki | 327/1 |
| 2007/0152719 A1 | 7/2007 | Wu et al. | |

* cited by examiner

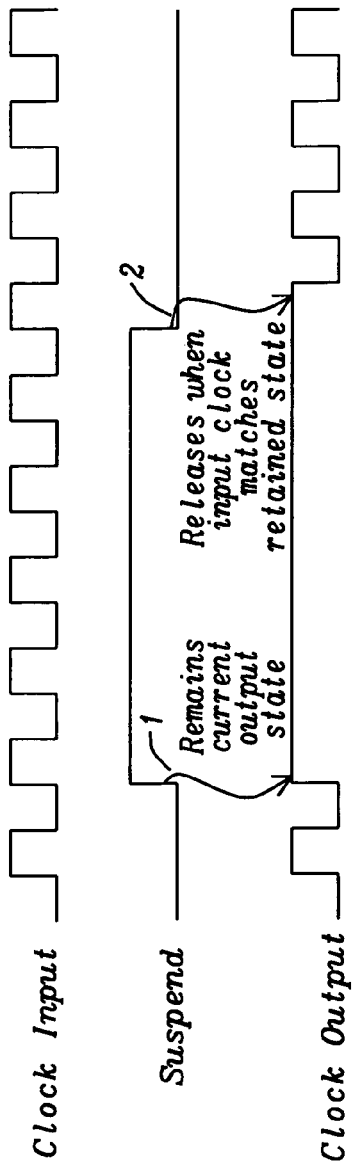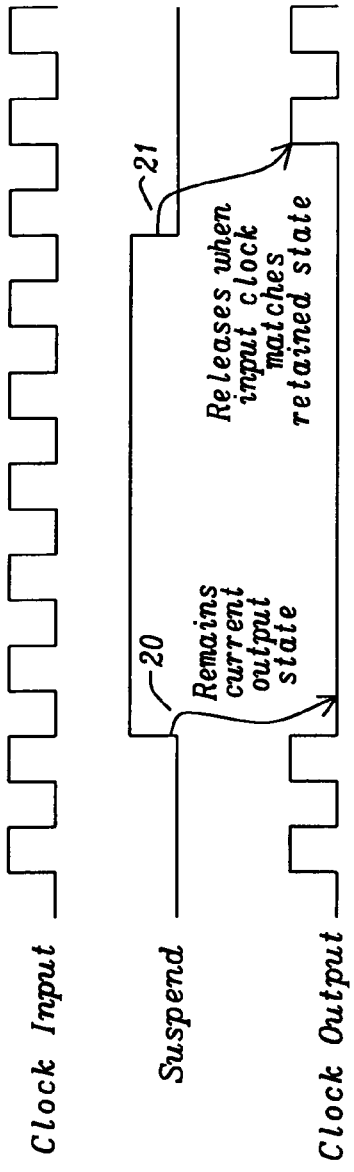

GLITCH-FREE CLOCK SUSPEND AND RESUME CIRCUIT

BACKGROUND OF THE INVENTION (1) Field of the Invention

This invention relates generally to the field of digital clock circuits and relates more specifically to a clock circuit, which can be instantly suspended and then resumed again with whole width clock pulses.

(2) Description of the Prior Art

Especially in applications as charge pumps or memory cells oscillators are used to provide clock signals. It is often required to suspend and then to resume the operation of such a clock. The challenge of the designers of such circuits is to allow a digital clock signal to be instantly halted without glitches, either in the high or low state, and then resume under control of an asynchronous "suspend" signal.

A glitch is defined as a high/low period that has not the same "width" as an input clock high/low period.

For example, a use for this would be a clock for a charge pump, which has to be instantly "suspended" and then "resumed" with whole width clock pulses.

There are patents or patent publications dealing with clock circuits, which can be suspended and then resumed, but they stop the output clock in a fixed state only (for example always low) after the suspend signal has occurred:

U.S. Patent (U.S. Pat. No. 5,808,486 to Smiley) proposes a clock enabling circuit that generates an output clock signal such that when the enable output signal changes to a logical false, the output clock signal returns to its steady-state value in a manner that does not produce any glitches, and preserves the duty cycle of the input clock. The circuit comprises a first D flip-flop that is positive-edge triggered, a second D flip-flop that is negative-edge triggered, and a two-input AND gate. The first flip-flop has the D input connected to a constant positive voltage, the positive-edge triggered clock input connected to the input clock signal, the Q output connected to the AND gate, and the Q-complement output connected to the asynchronous reset of the second flip-flop. The second flip-flop has the D input connected to the enable output signal, the negative-edge triggered clock input connected to the input clock signal, the Q output connected to the asynchronous reset of the first flip-flop, and the Q-complement output connected to the AND gate. The output of the AND gate is the output clock signal.

U.S. Patent Application Publication (US 2007/0152719 to Wu et al.) discloses a clock switching circuit, which comprises: a clock generator, receiving two different clock signals; a logic gate, coupled to an enable-signal generator and an output-clock generator, wherein during clock switching, the logic gate turns off output clock according to the signal edges of those two clock signals to avoid the problems of clock glitch and timing insufficiency, and the logic gate will not restore clock output until an appropriate timing occurs.

(U.S. Pat. No. 7,295,044 to Bucossi et al.) proposes a digital clock generation circuit (and a method for operating the same). The digital clock generation circuit includes a first, a second, a third differential comparator circuits. The first differential comparator circuit receives the positive differential clock signal and a reference voltage, and generates a first output signal. The second differential comparator circuit receives the positive and negative differential clock signal, and generates a second output signal. The third differential comparator circuit receives the reference voltage and the negative differential clock signal, and generates a third output signal. A high-high detecting circuit receives the first output signal, and the third output signal, and generates an Enable signal. The digital clock generation circuit further includes a latch circuit which receives the second output signal, and the Enable signal and generates a digital clock signal. The latch circuit comprises a latch with glitch or noise immunity.

(U.S. Pat. No. 6,021,501 to Shay) discloses a power management system. The system includes an oscillator interface for use in a power management system, a power recycle circuit for use in a power management system, a pad clock and self test for use in a power management system, a clock enable circuit for use in a power management system, a power level detect circuit for use in a power management system, an internal source clock generation circuit for use in a power management system, and a power-save mode change detection circuit for use in a power management system. The oscillator interface includes an circuit for interfacing with an external oscillator used as a source of oscillations. A clock stabilization filter masks out spurious crystal frequencies in the oscillations during start-up of the power management system following an enabling of a feedback loop. The clock stabilization filter has circuitry which provides that the oscillations will start with a rising transition after filtering. A bypassing circuit enables the clock stabilization filter when the external oscillator is a crystal oscillator and for bypassing the clock stabilization filter when the external oscillator is a can oscillator. A masking circuit masks the oscillations from the rest of the power management system. The masking circuit has circuitry which disables the clock masking after a falling edge of the oscillations and stats back up with a rising transition of the oscillations.

SUMMARY OF THE INVENTION

A principal object of the present invention is to achieve methods and systems to provide a digital clock signal, which can be instantly halted without glitches and then resumes under control of an asynchronous suspend signal with whole width clock pulses of either polarity.

A further object of the present invention is to use an asynchronous suspend signal to control the glitch-free suspension and resumption of the digital output clock pulses.

Another object of the present invention is to ensure a correct operation regardless of the width and position of the suspend pulse.

Another object of the present invention is to achieve an asynchronous logic implementation using standard cell logic gates.

Another object of the present invention is to achieve a circuit functionality being not dependent on the manufacturing technology used.

In accordance with the objects of this invention a method to provide a digital clock signal, which can be instantly halted without glitches and then resumes under control of an asynchronous suspend signal with whole width clock pulses of either polarity has been achieved. The method invented is comprising, first, the following steps of (1) providing a state machine circuit having a clock input signal from an oscillator and an asynchronous suspend input signal suspending a clock output signal while the suspend signal is ON, (2) checking if said suspend is OFF and, if positive go to step 3, else go to step 4, and (3) following with the clock output signal the clock input signal and go to step 2. The next steps are (4) retaining clock output signal in present state, (5) checking if the suspend signal goes to zero and if positive go to step 6, else go to step 2, and, finally, (6) resuming clock output signal following clock input signal when clock input signal state corresponds to retained clock output state and go then to step (2).

In accordance with the objects of this invention a circuit to provide a digital clock signal, which can be instantly halted in either polarity state without glitches and then resumes under control of an asynchronous suspend signal with whole width clock pulses has been disclosed. The circuit invented is comprising, first, a first NAND gate having inputs and an output, wherein a first input are input clock pulses from an oscillator and a second input is the output from a first inverter and the output is a reset input of a first RS-latch, said first inverter having an input and an output, wherein the input is the q-output of a second RS-latch and the output is connected to the second input of said first NAND gate and to a second input of a second NAND gate, and a second inverter having an input and an output, wherein the input are said input pulses from said oscillator and the output is connected to a first input of said second NAND gate. Furthermore the circuit comprises said second NAND gate having its output connected to a set input of said first RS-latch, said first RS-latch, wherein its q-output is the output of said circuit and its qn-output is connected to a first input of a second AND gate, and a third inverter having an input and an output, wherein its input is a suspend signal and the output is connected to a reset input of a second RS-latch. Finally the circuit is comprising a first AND-gate having inputs and an output, wherein a first input is the q-output of said first RS-latch and a second input are said input pulses from said oscillator and the output is connected to a first input of a NOR gate, said second AND gate wherein its second input is the output of said second inverter and its output is a second input of said NOR gate, said NOR gate wherein its output is a set input of said second RS-latch, and said second RS-latch.

BRIEF DESCRIPTION OF THE DRAWINGS

In the accompanying drawings forming a material part of this description, there is shown:

FIG. 1 shows the operation of the circuit invented with the example of an clock output signal, which suspends in a "high" state and resumes when the input clock is high.

FIG. 2 shows the operation of the circuit invented with the example of a clock output signal, which suspends in a "low" state and resumes when the input clock is high.

DESCRIPTION OF THE PREFERRED EMBODIMENTS

Figure 3:
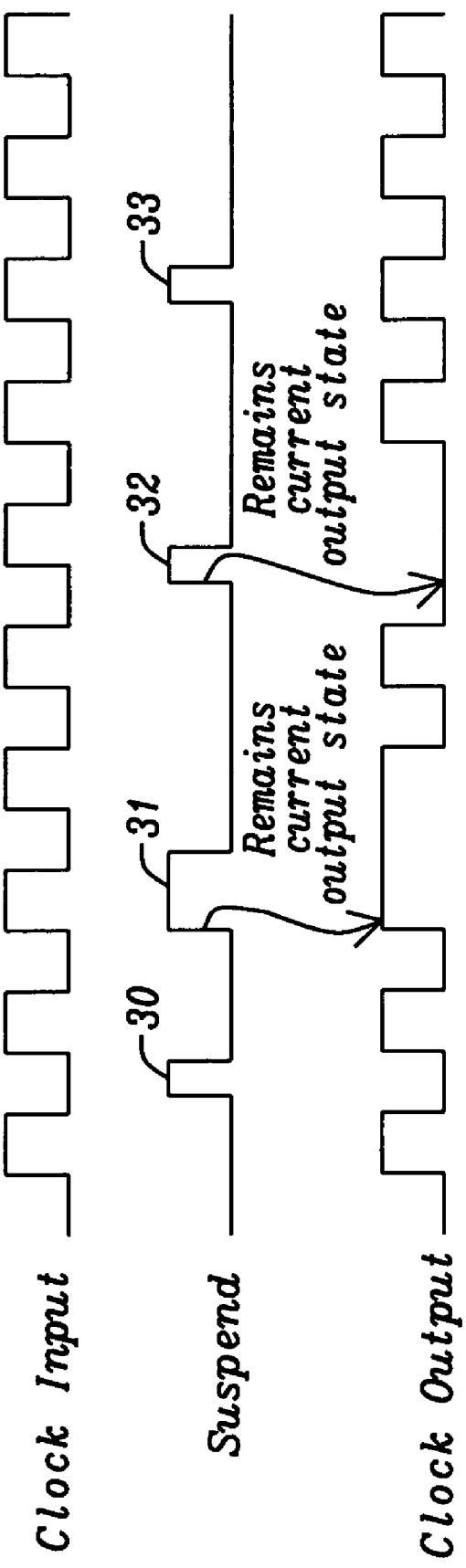
FIG. 3 shows four examples for short suspend signals.

The preferred embodiments disclose methods and systems to achieve a digital clock capable to be instantly halted without glitches, either in the high or low state, and then resume control of an asynchronous "suspend" signal.

In a preferred embodiment the invention is applied to a clock for a charge pump, which has to be instantly suspended and then resumed with whole width clock pulses, i.e. without glitches.

The circuit of the present invention suspends the clock output, in either a high or a low state, instantaneously with the suspend signal. There is no restriction on either the suspend pulse width or position in relation to the input clock. The cited prior art references stop the output clock in a fixed state (for example always low) after the suspend signal has occurred.

The circuit comprises an asynchronous state machine, which generates a clock output signal that follows the clock input signal while the suspend input is low. When the suspend signal goes high, the clock output retains the state it was in. When the suspend signal goes low, the clock output signal restarts at the same corresponding input clock state. For example, the two possible cases are:

a). if the clock output is suspended low, the output restarts when the clock input is low.

b). if the clock output is suspended high, the output restarts when the clock input is high.

If the suspend signal goes high, then low within a clock high or low period, the circuit operates correctly and the output clock continues as expected.

In a preferred embodiment the state machine is integrated together with an oscillator, providing the clock input signals, in an ASIC.

In integrated circuit design, Register Transfer Level (RTL) description is a way of describing the operation of a synchronous digital circuit. In RTL design, a circuit's behavior is defined in terms of the flow of signals (or transfer of data) between inputs and outputs, and the logical operations performed on those signals. The following RTL code describes the required function:

```
input suspend;
input clock_in;
output clock_out;
reg saved_clock;
if (suspend==1)
  begin
    clock_out = clock_out;
    saved_clock = 1;
  end
else
  begin
    if (saved_clock==1)
      begin
        if (clock_in==clock_out)
          begin
            saved_clock=0;
            clock_out=clock_in;
          end
        else
          clock_out = clock_out;
      end
    else
      begin
        clock_out=clock_in;
      end
  end
```

The diagram of FIG. 1 shows the operation of the circuit invented with the example of an clock output signal, which suspends in a "high" state and resumes when the input clock is high. The first arrow 1 indicates that the "high" current output state is retained and the arrow 2 indicates that the output clock resumes, when the input clock matches the retained "high" state.

The diagram of FIG. 2 shows the operation of the circuit invented with the example of an clock output signal, which suspends in a "low" state and resumes when the input clock is high. The arrow 20 indicates that the "low" current output state is retained and the arrow 21 indicates that the output clock resumes, when the input clock matches the retained "low" state.

It should be noted that in both examples of FIGS. 1 and 2 the output clock resumes when the input clock matches the retained state of output clock.

FIG. 3 shows four examples for short suspend signals. Suspend signals 30 and 33 are wholly within a high clock or low clock period and signals 31 and 32 overlap the 0-1 or 1-0 edges of the input transitions. The short suspend signals 30 and 33, which are wholly within a high clock or low clock period, do not cause the output clock to suspend. Only the suspend signals that overlap a clock transition, as signals 31 and 32 do, cause the output clock to suspend.

Figure 4:
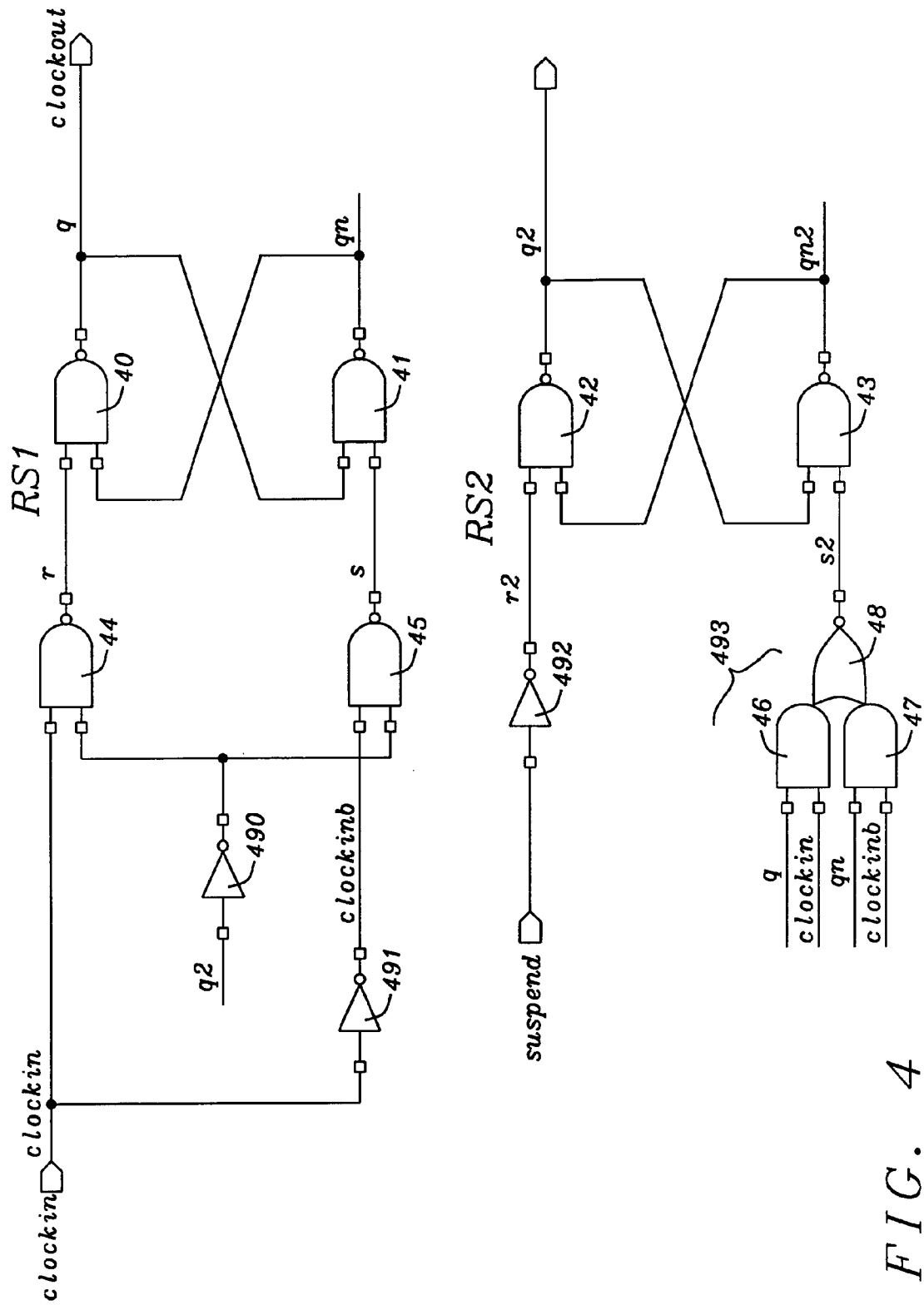
FIG. 4 illustrates a schematic of a preferred embodiment of an implementation of a circuit to accomplish the required operation.

The schematic of FIG. 4 illustrates a preferred embodiment of an implementation of a circuit to accomplish the required operation. In order to guarantee glitch free-operation the design uses an asynchronous-logic approach, this eliminates any logic race issues with the clock input and suspend signals. The circuit is integrated in an CMOS ASIC.

The circuit of FIG. 4 comprises two RS-latch structures RS1 and RS2. RS1 is used to output the clock, RS2 is used to retime the suspend signal.

A RS latch has two inputs, set (s) and reset (r). The s input is used to produce HIGH on q. The r input is used to produce LOW on q. Signal qn is a q complementary output, so it always holds the opposite value of q. The output of an S-R latch depends on current as well as previous inputs or state, and its state (value stored) can change as soon as its inputs change.

Each RS-latch structure RS1 and RS2 comprises two NAND gates. The RS-latch structure RS1, comprising NAND gates 40 and 41, has the reset input r and the set input s, the RS-latch structure RS2, comprising NAND gates 42 and 43, has the reset input r2 and the set input s2.

A first input clockin to the circuit invented is an output from a oscillator and is connected to a first input of a NAND gate 44, to an input of logic inverter 491, and to a second input of a AND gate 46. The output of the inverter 491, namely clockinb, is connected to a first input of a NAND gate 45 and to second input of AND gate 47.

The output q2 of the RS-latch structure RS2 is the input of a logic inverter 490, the output of inverter 490 is a second input of each of the NAND gates 44 and 45. The output of NAND-gate 44 is the reset input r of the RS-latch structure RS1, the output of NAND-gate 45 is the set input s of the RS-latch structure RS1.

The output q of RS-latch structure RS1 is the output clockout of the circuit invented. The complex OAI222 gate structure 493 comprises two AND gates 46 and 47 and a NOR gate 48. The complementary output qn of RS-latch structure RS1 is the first input of the AND gate 47. The outputs of the AND gates 46 and 47 form both inputs of NOR gate 48; the output of the NOR gate 48 is the set input s2 of the RS-latch structure RS2.

A second input suspend to the circuit invented is said suspend signal, which is input an logic inverter 492. The output of inverter 492 is the reset input r2 of the RS-latch structure RS2.

The following truth-table shows the operation of the NAND gate implementation of an RS-latch (logic states are referred to as "high" or "1" and "low" or "0"):

| r | s | q | qn |
|---|---|---|----|
| 0 | 0 | 1 | 1 |
| 1 | 0 | 0 | 1 |
| 0 | 1 | 1 | 0 |
| 1 | 1 | $q_{t-1}$ | $qn_{t-1}$ |

For a starting point of an explanation of the truth-table above it is assumed that signal q2 is low. In this state the RS-latch structure RS1 follows the input signal clockin; when clockin is low, it follows that r=1 and s=0, which sets the clockout signal q to reset low. When clockin is high, the clockout signal q is set high. When the q2=1 both signals r and s are high, keeping the RS-latch structure RS1 in its previous state.

The RS-latch structure RS2 is used to synchronize the suspend signal with the output clock. With suspend=1, r2=0 the q2 output is forced high. When suspend goes low, the r2 signal is consequently set high and the RS2 latch retains in its last state. The gate structure 493 waits for the clockin input signal to match the retained q output of the RS1-latch to make s2=0 and force q2 low. This restores the RS1 latch to following the clockin signal on the correct transition edge.

It should be understood that the asynchronous state machine of the present invention could be implemented in other ways as shown in FIG. 4, wherein cross-coupled NAND gates have been used. Alternatively the state machine could be implemented e.g. using cross-coupled NOR gates with the associated logic modified accordingly. Other implementations are possible also, as long the logic requirements of the application are fulfilled. The implementation shown in FIG. 4 has the advantage that a relatively low number of devices in a CMOS process is required.

Figure 6:
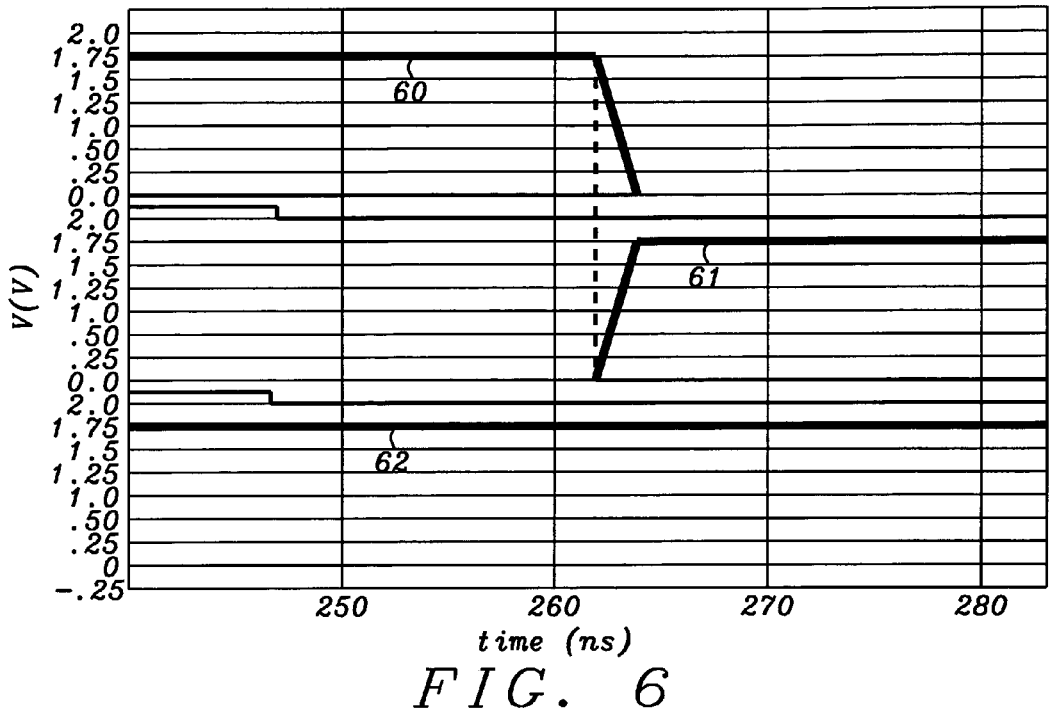
FIG. 6 shows a first simulation of the circuit design retaining a high output clock state.
Figure 7:
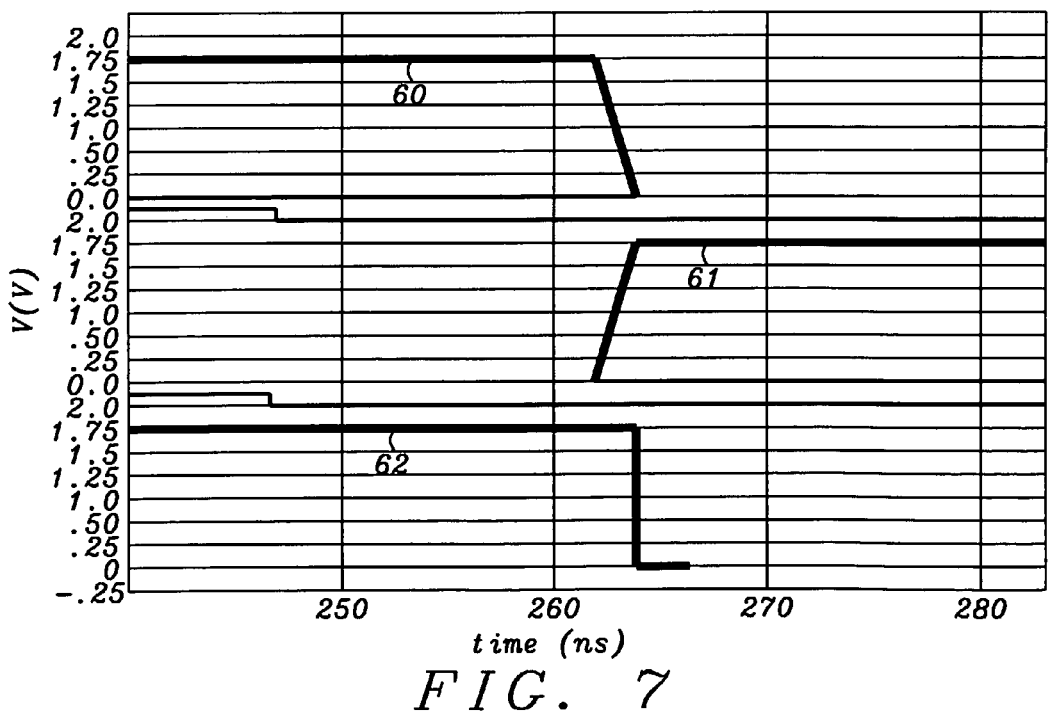
FIG. 7 shows a second simulation of the circuit design wherein a suspend signal is delayed compared to the simulation run showed in FIG. 6 and consequently a low output clock state is retained.

The design of the state machine invented has been verified by simulation in a 0.35μ CMOS process. As an example from simulation of the circuit design two simulation runs, illustrated in FIGS. 6 and 7, were performed to show the effect of moving the edge of the suspend signal 61 by 50 ps across the input clock transition. In both figures the input clock is illustrated by numeral 60, the suspend signal is illustrated by numeral 61, and the output clock is illustrated by numeral 62. The first case, shown in FIG. 6, retains a high output clock 62 state and the second case, shown in FIG. 7 retains a low output clock 62 state.

Figure 5:
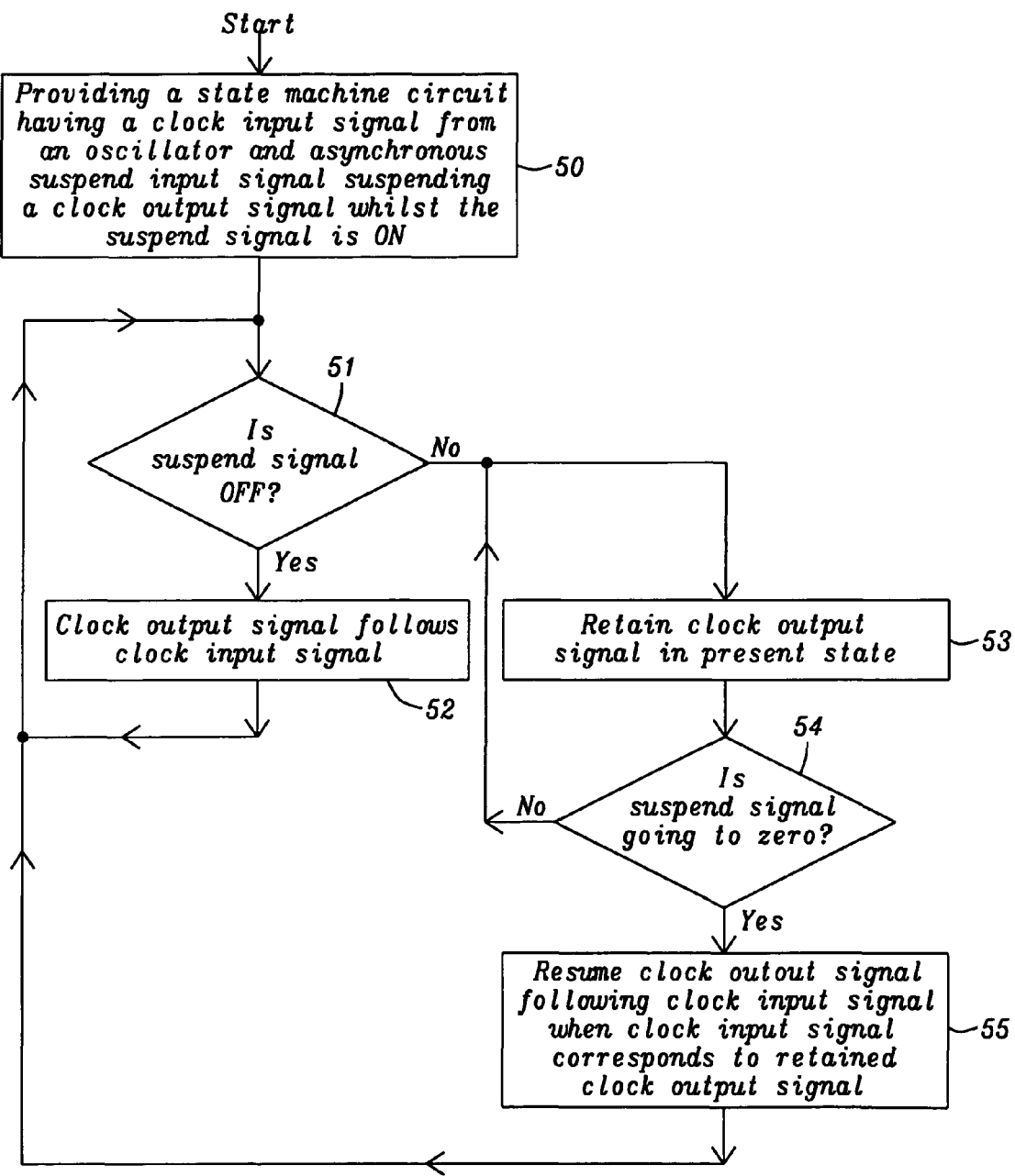
FIG. 5 illustrates a flowchart of the method invented to provide a digital clock signal.

FIG. 5 illustrates a flowchart of the method invented to provide a digital clock signal, which can be instantly halted without glitches and then resumes under control of an asynchronous suspend signal with whole width clock pulses. Step 50 illustrates the provision of a state machine circuit having a clock input signal from an oscillator and an asynchronous suspend input signal suspending a clock output signal while the suspend signal is ON. In step 51 is a check if the suspend signal is OFF. If the check of step 51 is positive the process flow goes to step 52, else the process flow goes to step 53. In step 52 the clock output signal follows the clock input signal, and then the process flow goes back to the check of step 51. In step 53 the clock output signal is retained in the present state. In step 54, following step 53, is a check if the suspend signal is going to zero. If the check of step 54 is negative, the process flow goes back to step 53, else the process flow goes to step 55. Step 55 describes the resumption of the clock output signal following the clock input signal when the clock input signal corresponds to the state of clock output signal as retained in step 53. Then the process flow goes back to step 51. Obviously the process ends after power OFF of the circuit.

The key points of the present invention are:
1. Glitch-free clock pulse generation instantly following the suspend signal, with the output suspended either high or low.
2. Correct operation regardless of the suspend pulse width and position; i.e. it is completely independent from the input clock.
4. Asynchronous logic implementation using standard cell logic gates.
5. NAND or NOR gate implementations of a RS-latch are equally valid.
6. Circuit functionality is not dependent on the manufacturing technology, i.e. CMOS, bipolar, Bi-CMOS, GaAs, I²L, etc. implementations are all equally valid.

While the invention has been particularly shown and described with reference to the preferred embodiments thereof, it will be understood by those skilled in the art that various changes in form and details may be made without departing from the spirit and scope of the invention.

What is claimed is:

1. A method to provide a digital clock signal, which can be instantly halted without glitches and then resumes under control of an asynchronous suspend signal with whole width clock pulses of either polarity comprising the following steps:
   (1) providing a state machine circuit having a clock input signal from an oscillator and an asynchronous suspend input signal suspending a clock output signal while the suspend signal is ON;
   (2) checking if said suspend is OFF and, if positive go to step 3, else go to step 4;
   (3) following with the clock output signal the clock input signal and go to step 2;
   (4) retaining clock output signal in present state;
   (5) checking if the suspend signal goes to zero and if positive go to step 6, else go to step 2; and
   (6) resuming clock output signal following clock input signal when clock input signal state corresponds to retained clock output state and go then to step (2).

2. The method of claim 1 wherein said state machine comprises NAND gates.

3. The method of claim 1 wherein said state machine comprises NOR gates.

4. The method of claim 1 wherein said state machine is integrated in an ASIC.

5. The method of claim 1 wherein the output signals continue to follow the input clock signals if the suspend signal goes ON and then OFF within an input clock high or low period.

6. A circuit to provide a digital clock signal, which can be instantly halted without glitches in either polarity state and then resumes under control of an asynchronous suspend signal with whole width clock pulses comprises:
   a first NAND gate having inputs and an output, wherein a first input are input clock pulses from an oscillator and a second input is the output from a first inverter and the output is a reset input of a first RS-latch;
   said first inverter having an input and an output, wherein the input is the q-output of a second RS-latch and the output is connected to the second input of said first NAND gate and to a second input of a second NAND gate;
   a second inverter having an input and an output, wherein the input are said input pulses from said oscillator and the output is connected to a first input of said second NAND gate;
   said second NAND gate having its output connected to a set input of said first RS-latch;
   said first RS-latch wherein its q-output is the output of said circuit and its qn-output is connected to a first input of a second AND gate;
   a third inverter having an input and an output, wherein its input is a suspend signal and the output is connected to a reset input of a second RS-latch;
   a first AND-gate having inputs and an output, wherein a first input is the q-output of said first RS-latch and a second input are said input pulses from said oscillator and the output is connected to a first input of a NOR gate;
   said second AND gate wherein its second input is the output of said second inverter and its output is a second input of said NOR gate;
   said NOR gate wherein its output is a set input of said second RS-latch; and
   said second RS-latch.

7. The circuit of claim 6 wherein said suspend signal is an asynchronous signal.

8. The circuit of claim 6 wherein said NAND gates are standard logic cells.

9. The circuit of claim 6 wherein said NOR gate is a standard logic cell.

10. The circuit of claim 6 wherein all components of the circuit are integrated in an ASIC.

11. The circuit of claim 6 wherein said ASIC is integrated in a smart card.

12. The circuit of claim 6 wherein its functionality is not dependent on the manufacturing technology.

13. The circuit of claim 6 wherein CMOS manufacturing technology has been used.

14. The circuit of claim 6 wherein a NAND gate implementation of a RS-latch has been used.

15. The circuit of claim 6 wherein a NOR gate implementation of a RS-latch has been used.

16. The circuit of claim 6 wherein said first and second AND gates and said NOR gate comprise a OAI222 gate structure.

* * * * *